United States Patent [19]

Hashimoto

[11] 4,415,384
[45] Nov. 15, 1983

[54] METHOD FOR MANUFACTURING A SEMICONDUCTIVE DEVICE

[75] Inventor: Masayuki Hashimoto, Tokyo, Japan

[73] Assignee: Clarion Co., Ltd., Tokyo, Japan

[21] Appl. No.: 382,325

[22] Filed: May 26, 1982

[30] Foreign Application Priority Data

May 27, 1981 [JP] Japan .................................. 56-79172

[51] Int. Cl.³ .................... H01L 21/223; H01L 21/265
[52] U.S. Cl. ...................................... 148/187; 148/1.5; 29/576 B; 29/578
[58] Field of Search ............... 148/187, 1.5; 29/576 B, 29/578

[56] References Cited

U.S. PATENT DOCUMENTS

| | | | |
|---|---|---|---|
| 4,006,046 | 2/1977 | Pravin | 148/187 |
| 4,111,726 | 9/1978 | Chen | 148/1.5 X |
| 4,127,931 | 12/1978 | Shiba | 29/571 |
| 4,199,378 | 4/1980 | van Gils | 148/187 X |
| 4,199,380 | 4/1980 | Farrell et al. | 148/1.5 |
| 4,263,066 | 4/1981 | Kolmann | 148/187 |
| 4,306,915 | 12/1981 | Shiba | 148/1.5 |
| 4,343,080 | 8/1982 | Hataishi et al. | 29/571 |
| 4,379,001 | 4/1983 | Sakai et al. | 148/187 X |

*Primary Examiner*—G. Ozaki
*Attorney, Agent, or Firm*—Flynn, Thiel, Boutell & Tanis

[57] ABSTRACT

A method for manufacturing a semiconductive device comprising: exposing a part of the surface of an n-type semiconductive substrate and covering the other part with an oxide film; partially providing the exposed part of the n-type semiconductive film with a film comprising a nitrided film and a polycrystalline silicon; doping boron through the exposed part of the n-type semiconductive substrate and the film provided on the same to thereby selectively form a p-type base region within the n-type semiconductive substrate; and, doping phosphorus or arsenic through the film on the exposed part of the n-type semiconductive substrate to thereby selectively form an collector ohmic region within the p-type base region.

6 Claims, 15 Drawing Figures

METHOD FOR MANUFACTURING A SEMICONDUCTIVE DEVICE

BACKGROUND OF THE INVENTION

This invention relates to a semiconductive device manufacturing method capable of easily manufacturing high frequency elements.

In order to get a transistor for use in a bipolar IC suitable for high frequency, in general, it is necessary to settle its cut-off frequency $f_1$-high. Such transistor for high frequency has conventionally been produced by the following process:

Step (a): As shown in FIG. 1(A), an n-type embedded region 2 is formed on the surface of a p-type silicon substrate 1 by the well-known selective diffusion method, an n-type epitaxial film 3 is thereafter provided on the surfaces of the p-type silicon substrate 1 and the n-type embedded region 2 by the well-known epitaxial method and an oxide film 4 is formed by oxidizing the surface of the n-type epitaxial film 3.

Step (b): As shown in FIG. 1(B), the oxide film 4 is selectively removed at positions thereof wherein inactive base regions for lowering base resistance are provided to thereby form windows 5A and 5B by well-known photolithography method.

Step (c): As shown in FIG. 1(C), p-type inactive base regions 6A and 6B are selectively formed by doping boron from the windows 5A and 5B and the windows are thereafter covered by the oxide film 5 again.

Step (d): As shown in FIG. 1(D), the oxide film 4 is selectively removed at a predetermined position thereof for providing an active base region in to thereby form a window 7. Through the window 7, the p-type inactive base regions 6A and 6B as well as the n-type collector region 3 are exposed.

Step (e): As shown in FiG. 1(E), a p-type active base region 8 is formed by doping boron from the window 7. The p-type base region 8 is so formed to communicate with the inactive base regions 6A and 6B and to be lower and shallower in its impurity concentration than the inactive base regions 6A and 6B. The window 7 is thereafter covered by the oxide film 4 again.

Step (f): As shown in FIG. 1(F), the oxide film 4 is removed at predetermined places for providing an emitter region and a collector ohmic region to thereby form windows 9 and 10.

Step (g): As shown in FIG. 1(G), an n-type emitter region 11 and a collector ohmic region 12 are formed by doping phosphorus or arsenic from the windows 9 and 10. The windows 9 and 10 are thereafter covered by the oxide film 4 again.

Step (h): As shown in FIG. 1(H), the oxide film 4 is removed at portions thereof for providing an emitter electrode, base electrode and collector electrode to thereby form windows 13, 14 and 15.

By sequently mounting metallic material like aluminum on the individual windows 13, 14 and 15, an npn transistor is finished.

In such conventional manufacturing method, the window 9 for making the emitter region 11 is so designed to be wider than the window 13 for thereafter making the emitter electrode taking into consideration imposing error produced upon imposing a mask by the photolithography method. This means that the actual area of the emitter must be much larger than the truely effective one.

Further, although positions of the emitter region and base region with respect to each other are determined by accuracy of superposing a mask, fine working has been difficult for the same reason. Such conventional method does not permit formation of a shallow emitter region and a thin base width. Beside these, the base region is formed over two times, which leads to increase of man hours and poor characteristic reproducibility due to existence of errors.

For those reasons given above, according to the conventional method, it has been difficult to settle cut-off frequency high and a high-frequency transistor has not been realized.

SUMMARY OF THE INVENTION

It is therefore an object of the present invention to provide a method for manufacturing a transistor free from errors upon superposing a mask by a photolithography method.

In accordance with the present invention, there is provided a method for manufacturing a semiconductive device comprising processes:

exposing a part of the surface of a first conductive-type semiconductive substrate and providing the other part with a first film;

partially forming a second film on said exposed part of the surface of the first conductive-type semiconductive substrate;

doping second conductive-type impurities through said exposed part and said second film to thereby selectively form a second conductive-type semiconductive region within said first conductive-type semiconductive substrate; and doping first-conductive-type impurities through said second film to thereby selectively form a first conductive-type semiconductive region within said substrate.

DETAILED DESCRIPTION OF THE PREFERRED EMBODIMENT

Figure 1A:
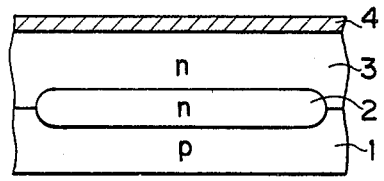
FIGS. 1(A) to (H) are sectional views of a semi-conductive device showing a conventional manufacturing method in sequence.
Figure 1E:
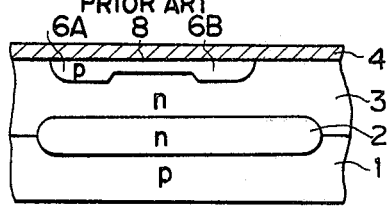
Figure 1B:
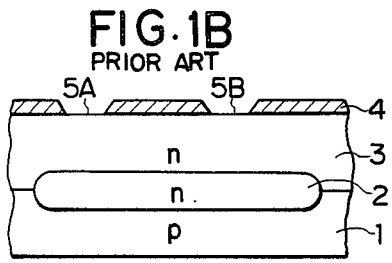
Figure 1F:
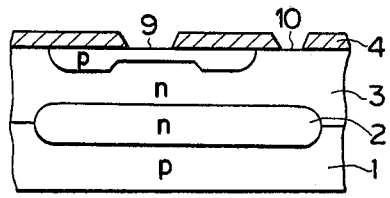
Figure 1C:
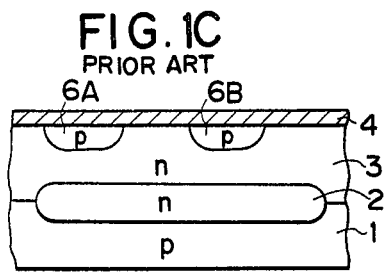
Figure 1G:
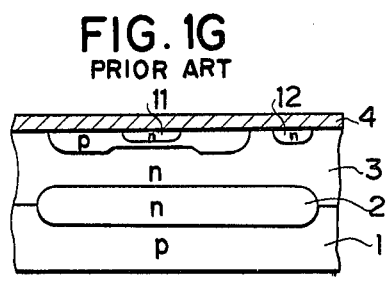
Figure 1D:
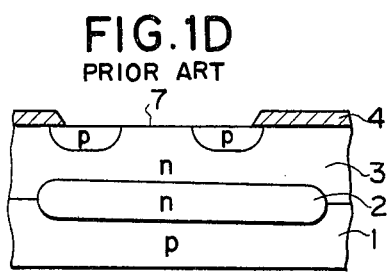
Figure 1H:
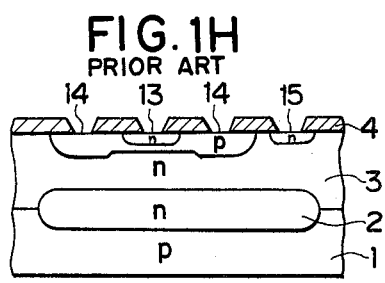

The present invention will now be described in detail referring to the preferred embodiment illustrated in the drawings, FIGS. 2(A) to 2(G), in manufacturing sequence.

Figure 2A:
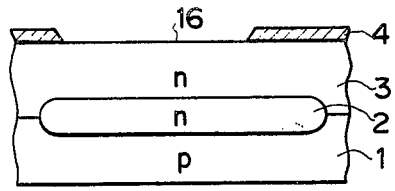
FIGS. 2(A) and (G) are sectional views of a semiconductive device showing the manufacturing method according to the present invention in sequence.
Figure 2B:
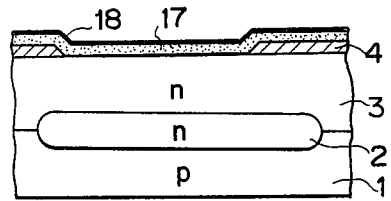

Step (a): As shown in FIG. 2(A), an n-type embedded region 2 and thereafter an n-type first conductive epitaxial film 3 are provided on the surface of a p-type silicon substrate 1. Then, an oxide film 4 as a first film is formed and partially removed at a predetermined place thereof for making a base region to thereby form a window 16.

Step (b): As shown in FIG. 2 (B), a second film comprising a polycrystalline silicon film 17 and a nitrided film 18 so as to cover the surfaces of the window 16 and oxide film 4 by the well-known CVD method.

Figure 2C:
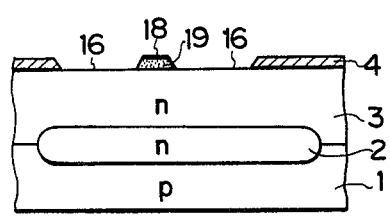

Step (c): As shown in FIG. 2(C), the polycrystalline silicon film 17 and nitrided film 18 are removed except the portion 19 for thereafter serving as an emitter contact by etching. Sequently, boron ions as being second conductive type impurities are implanted in the substrate through the window 16 and the portion 19 with appropriate energy and dosing amount.

Figure 2D:
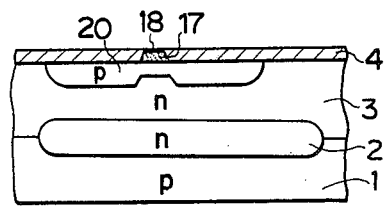

Step (d): As shown in FIG. 2(D), by applying heating and oxidizing treatments, the implanted boron ions are doped at a desired concentration and to a desired depth permitting achievement of a p-type second conductive base region 20. The window 16 is thereafter covered by the oxide film 4 again. Owing to the process mentioned in the above, conventional processes for providing inactive base region and active base region, respectively, are replaced by one process for providing a base region 20. The depth and concentration of the base region 20, when the heat treatment time is constant, may be designed as desired by changing energy and dosing amount upon ion implantation as well as thickness of the polycrystalline silicon film 17 and the nitrided film 18.

The doping depth of impurities beneath the place 19 of the polycrystalline silicon film 17 and the nitrided film 18 is shallower than the other part due to existence of these films.

Figure 2E:
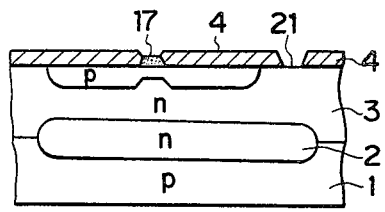

Step (e): As shown in FIG. 2(E), the polycrystalline silicon film 17 is exposed by etching the remaining nitrided film 18 and the oxide film 4 is removed at the place thereof for providing a collector ohmic region to thereby form a window 21.

Figure 2F:
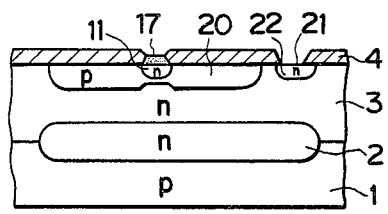

Step (f): As shown in FIG. 2(F), by doping phosphorus or arsenic through the window 21 and the polycrystalline silicon film 17 to thereby form a collector ohmic region 22 and an n-type emitter region 11 in the p-type base region 20.

The area of the emitter region 11 is determined by the remaining part 19 of the polycrystalline silicon film 17.

Figure 2G:
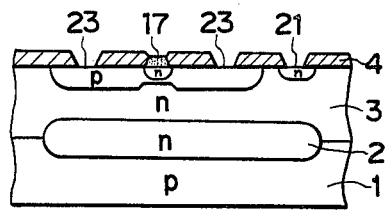

Step (g): As shown in FIG. 2(G), the oxide film 4 is removed at the portion thereof for providing base electrodes to thereby form windows 23. Subsequently, a base electrode and a collector electrode are formed by providing metallic material in the windows 23 and 21 while the polycrystalline silicon film 17 connected to the emitter region, as it is, is used as an emitter electrode. Thus, an npn transistor is finished.

As apparent from the description in the above, according to the present invention, since the emitter region is formed through the polycrystalline silicon film provided on the base region, its dimension depends on the area of the polycrystalline silicon film and its minimum dimension is determined by resolution of a light exposer. This permits obtaining larger effective area of the emitter.

Further, since the part in the base region corresponding to the active base region is formed through the polycrystalline silicon film regulating the area of the emitter region, it can always be formed in the exactly corresponding position to the emitter region. At the same time, the inactive base region and the active base region can be formed simultaneously. Such method for providing the emitter region and the base region by doping impurities through the common polycrystalline silicon film eliminates possibility of errors caused upon superposing a mask to thereby permit fine working of semiconductive devices. Therefore, shallow emitter region and thin base width can easily be made.

Thus, according to the present invention where a transistor can be made as being free from errors upon superposing a mask, it is possible to obtain high cut-off frequency and to improve characteristic reproducibility.

I claim:

1. A method for manufacturing a semiconductive device comprising:
   exposing a part of the surface of a first conductive-type semiconductive substrate and providing the other part with a first film;
   partially forming a second film on said exposed part of the surface of the first conductive-type semiconductive substrate;
   doping second conductive-type impurities through said exposed part and said second film to thereby selectively form a second conductive-type semiconductive region within said first conductive-type semiconductive substrate; and
   doping first conductive-type impurities through said second film to thereby selectively form a first conductive-type semiconductive region.

2. A method as claimed in claim 1 further comprising doping first conductive-type impurities within said first conductive-type semiconductive substrate to thereby selectively form a first conductive-type semiconductive region within said substrate.

3. A method as claimed in claim 1 or claim 2 in which said second film comprises at least polycrystalline silicon.

4. A method as claimed in claim 1 or claim 2 in which said second film comprises polycrystalline silicon film and nitrided film.

5. A method for manufacturing a semiconductive device comprising:
   providing a first film on the surface of a first conductive-type semiconductive substrate and exposing a part thereof to form a first window at a portion for forming a base region;
   providing said window with a second film comprising polycrystalline silicon film and nitrided film;
   removing said second film except a part thereof for serving as an emitter contact and doping second conductive-type impurities through said part and said first window to thereby selectively forming a second conductive-type base region within said first conductive-type semiconductive substrate;
   removing said nitrided film from said remaining second film to thereby expose said polycrystalline silicon film and removing said first film at the part thereof for providing a collector ohmic region in to thereby form a second window; and
   doping first conductive-type impurities through exposed polycrystalline silicon film and said second window to thereby selectively form the collector ohmic region within said second conductive-type base region and a first conductive-type emitter region at a position corresponding to said second window within said first conductive-type semiconductive substrate.

6. A method as claimed in claim 5 further comprising:
   selectively removing said first film at a part thereof corresponding to said base region to thereby form a third window; and
   providing said second and third windows with a collector electrode and a base electrode, respectively.

* * * * *